(12) United States Patent
Ahmed et al.

(10) Patent No.: US 10,598,838 B2
(45) Date of Patent: Mar. 24, 2020

(54) PIXEL LEVEL POLARIZER FOR FLEXIBLE DISPLAY PANELS

(71) Applicant: INTEL CORPORATION, Santa Clara, CA (US)

(72) Inventors: Khaled Ahmed, Anaheim, CA (US); Kunjal Parikh, San Jose, CA (US); Zhiming Zhuang, Sammamish, WA (US); Jun Jiang, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/022,837

(22) Filed: Jun. 29, 2018

(65) Prior Publication Data

US 2019/0041562 A1     Feb. 7, 2019

(51) Int. Cl.
| | |
|---|---|
| *G02B 26/00* | (2006.01) |
| *G02F 1/01* | (2006.01) |
| *G02B 5/30* | (2006.01) |
| *H01L 27/12* | (2006.01) |
| *H01L 33/58* | (2010.01) |
| *H01L 23/538* | (2006.01) |
| *G09G 3/32* | (2016.01) |
| *H01L 25/075* | (2006.01) |
| *H01L 33/62* | (2010.01) |

(52) U.S. Cl.
CPC ........ *G02B 5/3025* (2013.01); *H01L 23/5387* (2013.01); *H01L 27/1214* (2013.01); *H01L 27/1218* (2013.01); *H01L 33/58* (2013.01); *G02B 2207/101* (2013.01); *G09G 3/32* (2013.01); *G09G 2380/02* (2013.01); *H01L 25/0753* (2013.01); *H01L 33/62* (2013.01); *H01L 2933/0058* (2013.01); *H01L 2933/0066* (2013.01)

(58) Field of Classification Search
CPC .. G02B 5/3025; G02B 5/3041; G02B 5/3083; G02B 2207/101; G03H 2001/0224; G03H 2225/55; G03H 2225/60; G03H 2227/02; G09G 3/32; G09G 2380/02; H01L 23/5387; H01L 25/0753; H01L 27/1214; H01L 27/3262; H01L 33/58; H01L 33/62; H01L 51/5281; H01L 51/0097; H01L 2933/0058; H01L 2933/0066
See application file for complete search history.

(56) References Cited

U.S. PATENT DOCUMENTS

| | | | |
|---|---|---|---|
| 5,692,226 A * | 11/1997 | Hall | G03B 35/10 359/465 |
| 6,175,398 B1 * | 1/2001 | Yamada | G02B 5/3016 349/165 |
| 10,081,887 B2 * | 9/2018 | Manipatruni | D03D 1/0088 |
| 10,325,894 B1 * | 6/2019 | Pan | H01L 25/167 |
| 2002/0158288 A1 * | 10/2002 | Yamazaki | G02F 1/13454 257/343 |

(Continued)

*Primary Examiner* — Michael J Eurice (57) ABSTRACT

Disclosed herein are display panels, display panel stacks, and techniques to manufacture such display panel stacks where a polarizer is provided for each illumination element of the display panel stack. A polarizer can be formed onto each individual illumination element once the illumination element is transferred to the backplane. The polarizer can be arranged to polarize light emitted from the illumination element and light incident on the display from ambient.

23 Claims, 7 Drawing Sheets

(56) References Cited

U.S. PATENT DOCUMENTS

| | | | |
|---|---|---|---|
| 2003/0141504 A1* | 7/2003 | Kuwabara | H01L 27/1214 257/66 |
| 2004/0125430 A1* | 7/2004 | Kasajima | G02F 1/133536 359/247 |
| 2004/0164946 A1* | 8/2004 | Cavanaugh | G02F 1/133382 345/101 |
| 2004/0165131 A1* | 8/2004 | Anderson | G02F 1/1339 349/123 |
| 2005/0002098 A1* | 1/2005 | Allen | G02B 5/0236 359/485.01 |
| 2007/0037352 A1* | 2/2007 | Suzawa | H01L 27/3258 438/282 |
| 2008/0094320 A1* | 4/2008 | Parikh | G09G 3/3233 345/76 |
| 2008/0137010 A1* | 6/2008 | Kumai | G02B 5/3058 349/96 |
| 2010/0027083 A1* | 2/2010 | Kroll | G03H 1/02 359/9 |
| 2010/0046049 A1* | 2/2010 | Kroll | G03H 1/02 359/9 |
| 2010/0046050 A1* | 2/2010 | Kroll | G03H 1/02 359/9 |
| 2010/0097439 A1* | 4/2010 | Kroll | G03H 1/0005 348/14.02 |
| 2010/0103485 A1* | 4/2010 | Haussler | G03H 1/02 359/9 |
| 2010/0118117 A1* | 5/2010 | Kroll | G03H 1/02 348/40 |
| 2010/0149618 A1* | 6/2010 | Sprague | G02B 27/0172 359/259 |
| 2010/0182552 A1* | 7/2010 | Park | H01L 51/5281 349/114 |
| 2011/0149018 A1* | 6/2011 | Kroll | G03H 1/02 348/40 |
| 2012/0075432 A1* | 3/2012 | Bilbrey | G01J 4/00 348/48 |
| 2012/0127184 A1* | 5/2012 | Satoh | H04N 9/3129 345/530 |
| 2013/0075699 A1* | 3/2013 | Brown | B82Y 30/00 257/21 |
| 2013/0135328 A1* | 5/2013 | Rappoport | G06F 3/0481 345/522 |
| 2013/0293871 A1* | 11/2013 | Gruev | G01J 3/2803 356/73 |
| 2014/0192277 A1* | 7/2014 | Yilmaz | G06F 3/0412 349/12 |
| 2014/0204128 A1* | 7/2014 | Jiang | G02F 1/133617 345/690 |
| 2015/0198749 A1* | 7/2015 | Ye | G02B 5/18 359/581 |
| 2015/0357504 A1* | 12/2015 | Chen | H01L 31/028 257/27 |
| 2016/0027963 A1* | 1/2016 | Jun | H01L 33/06 257/13 |
| 2016/0170116 A1* | 6/2016 | Kim | G02B 5/3058 257/773 |
| 2017/0018214 A1* | 1/2017 | Black | G02F 1/29 |
| 2017/0023803 A1* | 1/2017 | Han | G02F 1/015 |
| 2017/0270637 A1* | 9/2017 | Perreault | G06T 3/4053 |
| 2017/0293171 A1* | 10/2017 | Yamazaki | G02F 1/133603 |
| 2018/0249151 A1* | 8/2018 | Freeman | G16H 20/30 |
| 2018/0292654 A1* | 10/2018 | Wall | G02B 27/0081 |
| 2019/0166342 A1* | 5/2019 | Kondo | H04N 5/225 |

* cited by examiner

Logic Flow
500

Attach uLEDs to backplane.
510

↓

Deposit dielectric over uLEDs.
520

↓

Form nano-structure(s) over uLEDs.
530

PIXEL LEVEL POLARIZER FOR FLEXIBLE DISPLAY PANELS

TECHNICAL FIELD

Embodiments described herein generally relate to color display panels and particularly to foldable color display panels for mobile devices.

BACKGROUND

Mobile devices often include display panels. Due to the mobile nature of such devices, they are often used outdoors or in strong lighting. For example, a mobile device could often be used in direct sunlight. The contrast of the display affects the visibility or viewability of the display in such strong lighting conditions.

DETAILED DESCRIPTION

The present disclosure is generally directed to integrating an optical polarizer onto each pixel of a display panel. Such display panels could be implemented in mobile devices, such as, for example, mobile phones, tablet computers, laptop computers, electronic readers, or the like. Furthermore, the display panel with integrated optical polarizers on each pixel can provide for a flexible, or even foldable, display as the individual polarizers can provide flexibility to the display panel. Said differently, the individual polarizers may not substantially inhibit movement of a flexible or foldable display panel. Some embodiments may be particularly applicable to "converged mobility" devices. In general, converged mobility devices refer to computing devices, which often include display panels, where multiple uses or form factors are converged together into a single device.

In general, a display panel a light emitting element comprises a frontplane coupled to a backplane. The backplane generally comprises various switching elements (e.g., thin-film-transistors (TFTs), or the like) arranged to drive illumination elements (e.g., light emitting diodes (LEDs), or the like) disposed in the frontplane. Various types of illumination elements can be provided in the frontplane, such as, for example micro LEDs (μLEDs), organic LEDs (OLEDs), liquid crystal display (LCD) elements, or the like.

The present disclose provides to integrating a polarizer onto each illumination element. For example, a polarizer can be formed onto each individual illumination element once the illumination element is transferred to the backplane. In some embodiments, the polarizer can be arranged to simply polarize light emitted from the illumination element. With other embodiments, the polarizer can be arranged to both polarize and "steer" or direct the light emitted from the illumination element.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a feature, structure, or characteristic described relating to the embodiment is included in at least one embodiment. The appearances of the phrases "in one embodiment," "in some embodiments," and "in various embodiments" in various places in the specification are not necessarily all referring to the same embodiment.

The present disclosure provides an advantage in that individual polarizers are formed on each illumination element. Thus, flexible display panels (e.g., those with a flexible frontplane, flexible backplane, or flexible frontplane and flexible backplane) can retain their flexibility while still being configured with polarizers to improve the contrast ratio (CR) and/or view ability of the display in bright light (e.g., outdoors, or the like).

The ambient CR of a display can be expressed as a ratio of the brightest and darkest element of the display, taking into account the ambient light reflected from it. This is reflected in Equation 1, shown below:

$$CR = \frac{L_{ON} + R_D L_A}{L_{OFF} + R_D L_A} \quad (1)$$

where $L_{ON}$ and $L_{OFF}$ are the luminance values from the bright and dark regions, respectively, of the display and $R_D L_A$ represents the luminance due to reflected ambient light. The dark room CR is limited by the darkness of the off pixel which can be nearly zero in OLED displays. In general, polarizers incorporated into displays (e.g., LCD displays, μLED displays, OLED displays, or the like), such as, for example, those provided by the present disclosure, enhance the CR of the display by blocking (at least partially) internal reflected light from entering a viewer's eyes.

Figure 1:
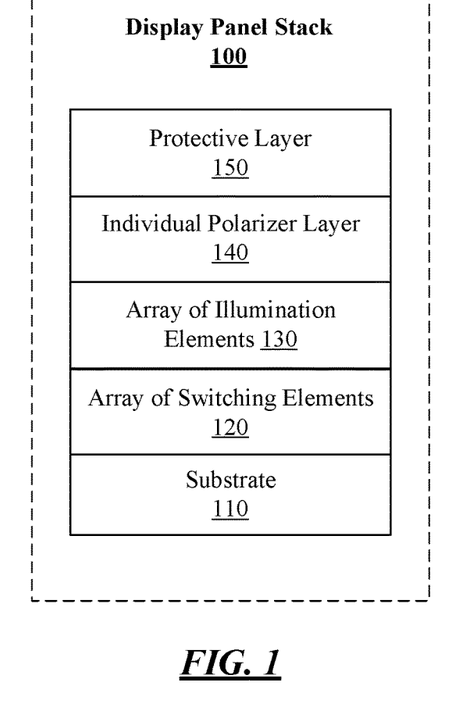
FIG. 1 illustrates an embodiment of a display panel stack.

FIG. 1 illustrates a portion of a display panel stack 100, arranged according to various embodiments of the present disclosure. The display panel stack 100 includes a substrate 110, an array of switching elements 120, an array of illumination elements 130, individual polarizer layer 140 and a protective layer 150. It is noted, that the individual polarizer layer 140 comprises individual polarizers for each illumination element of the array of illumination element 130. Examples of such polarizers are described below (e.g., FIGS. 2-5).

The display panel stack 100 may be implemented in a variety of displays and/or devices including displays. For example, the display panel stack 100 may be implemented in a monitor, a television, a smart phone, a Ultrabook, a tablet, a laptop, a wearable computing device (e.g., a watch, glasses, a headset, or the like), a home automation device (e.g., a thermostat, a control panel, or the like).

It is important to note, that the display panel stack 100 can include more layers than depicted, less layers than depicted, or different configurations of layers than depicted. For example, the display stack 100 may be implemented with various touch (e.g., capacitive, or the like) layers, diffusive layers, reflective layers, privacy layer, pressure layers, etc. Examples are not limited in this context. Accordingly, an exhaustive depiction and listing of the number and variety of layers that may be included in the display panel stack 100 is not made for purposes of brevity. The components of the display panel stack 100 depicted in FIG. 1 are selected for purposes of clarity of presentation only and not to be limiting. Importantly, the display panel stack 100 includes the array of illumination elements 130 and the individual polarizer layer 140.

In general, display panel stack 100 is formed on a substrate 110, such as, for example, glass, polyimide films, or the like. In some examples, substrate 110 may be flexible. The array or switching elements 120 can comprise a number of switching elements arranged to cause light to be illuminated by the array of illumination elements 130 to depict an image by the display panel stack 100. In some examples, the array of switching elements can include thin-film-transistor (TFT) components, Typically, the substrate 110 and array of switching elements 120 are collectively referred to as the backplane 101.

The array of illumination elements 130 can include any of a variety of elements arranged to emit light (e.g., μLED or OLED). The array of switching elements 120 and the array of illumination elements 130 are coupled and arranged to form an array of pixels, which can selectively emit light (e.g., on a per pixel basis) to display an image. The individual polarizer layer 140 includes a polarizer for each element of the array of illumination elements 130. In some examples, the polarizers are formed on or above each illumination element (e.g., μLED, OLED, vertical-cavity surface-emitting laser (VCSEL), or the like). The protective layer 150 may comprise one or more films, layers, or components to protect the display panel stack 100. For example, the protective layer 150 may be glass, acrylic, a flexible film, or the like. Typically, the substrate array of illumination elements, the individual polarizer layer 140 and the protective layer 150 are collectively referred to as the frontplane 103.

During operation, the polarizers from individual polarizer layer 140 can significantly reduce $R_D$ from Equation 1. Said differently, unpolarized ambient light goes through a linear polarizer, polarizing the light perpendicular to the direction of propagation. The light then goes through a quarter-wave phase retardation film and becomes right-circularly polarized. Circularly polarized light changes orientation when it bounces off a reflecting surface, that is, the reflected light becomes left-circularly polarized. When the light goes through the quarter-wave film again, it reverts to linear polarization, but this time in an orientation which is not allowed by the linear polarizer. The linear polarizer then blocks the reflected light.

The advantage of using circular polarizers in displays is that only the reflected light is nearly blocked. In display panel stacks implemented with OLEDs, the light emitted by the OLEDs can be transmitted, but only with linear polarization. Unfortunately, in this process nearly 60% of the OLED light may be cut out. However, the effect is that circular polarizer will still work to improve CR because they cut more reflected light than the device emitted light. For example, $R_D$ from Equation 1 is ~25% without circular polarizer and ~0.1% with circular polarizer. For $L_{ON}$=200 nits and 400 nits for the cases without and with circular polarizer, and with $L_{OFF}$=0 for simplicity, the CR is calculated to be 1.025 and 13.5 without and with the circular polarizer, respectively. It is noted, however, that circular polarizers are expensive and generally not bendable for use in flexible displays. Furthermore, conventional display panels have a limited transmittance due to the nature of the circular polarizers and polarizer film used. In some examples, the transmittance is limited to ~40%.

The present disclosure provides to form individual polarizers, referred to herein as "digital polarizers" for each element of the array of illumination element. Thus, flexibility of the display panel stack can be preserved while still providing or the increase in CR due to polarizers. Transmittance of display panels according to the present disclosure can be ~50%, which is a significant improvement over conventional display panels.

Figure 2:
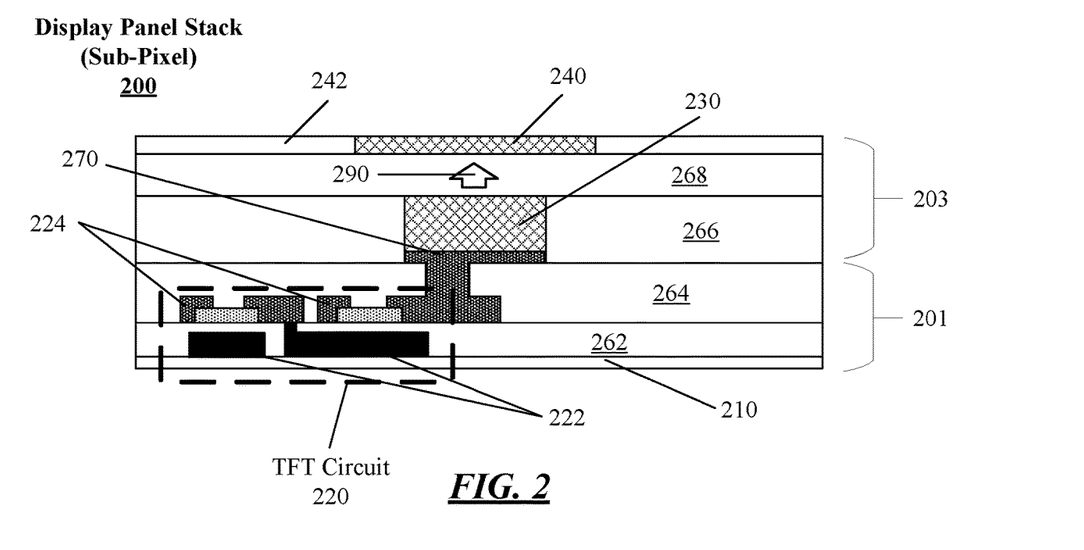
FIG. 2 illustrates an embodiment of a portion of a display panel stack.

FIG. 2 illustrates an example of a portion of a display panel stack 200, arranged according to example of the present disclosure. It is noted, that the display panel stack depicted in FIG. 2 utilizes μLED. Furthermore, the balance of the disclosure often refers to and utilizes examples of display panels with μLED. This is done for convenience and clarity. However, it is to be appreciated that the present disclosure can be implemented to provide and/or form display panels having integrated individual polarizers, or digital polarizers, for display panels formed from other technologies, such as, OLEDs, VCSELs, or the like.

As depicted in this figure, the display panel stack 200 includes a backplane 201 and a frontplane 203. The backplane 201 includes a glass substrate 210 upon which a TFT circuit 220 is formed. The TFT circuit 220 comprises metal gates 222 formed in a oxide layer 262 (e.g., gate oxide layer, or the like). The metal gates 222 are coupled to source and drain components 224 formed in a dielectric layer 264. The source and drain components are coupled to an electrical contact pad 270, upon which a μLED 230 is disposed.

The front plane comprises the μLED 230 disposed in a second oxide layer 266 (e.g., carbon-doped oxide, or the like). Above the oxide layer 266 is a third oxide layer 268 (e.g., a transparent conducting oxide layer or cathode layer, or the like). Above the μLED 230 is a digital polarizer 240. As depicted, the digital polarizer 240 is disposed above the μLED 230. In some examples, the digital polarizer has a larger surface area than the μLED 230. The digital polarizer is formed within a fourth oxide layer 242 (e.g., a chromium oxide layer, or the like).

During operation, the μLED 230 emits light 290. In general, light emitted by a μLED is mostly collimated. Thus, blocking some of the ambient reflected light via the polarizer 240 may be done while still preserving the image and color quality of the emitted light 290.

As noted above, a display panel stack includes arrays of switching elements, illumination elements, and polarizers for each illumination element. The display panels tack 200 depicts a single element of each of these arrays, which may be referred to as a pixel, or a subpixel. In some examples, a number of elements can be grouped to form a pixel. For example, each pixel of a display may correspond to a red, green and blue subpixel.

Figure 3:
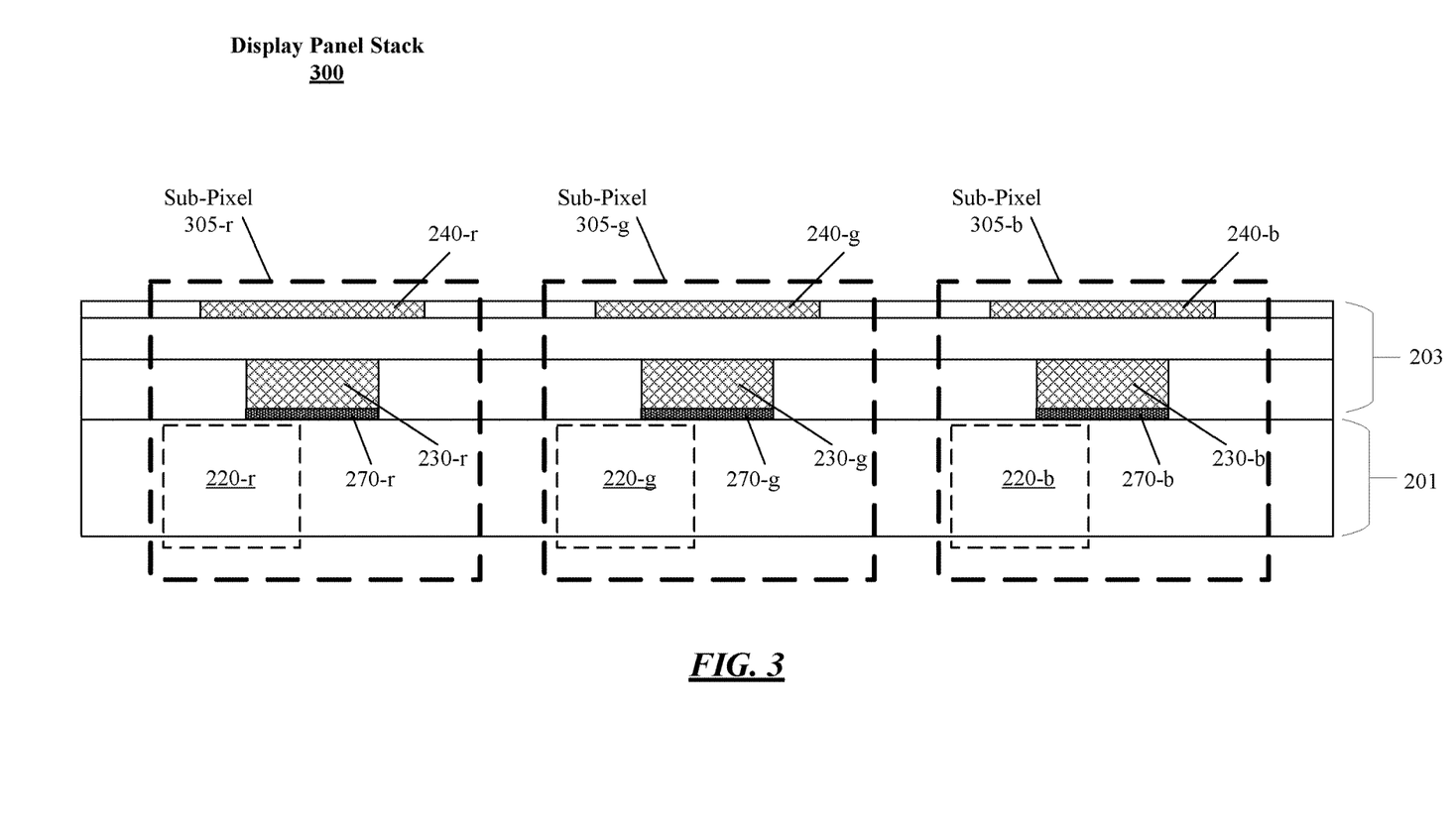
FIG. 3 illustrates an embodiment of display panel stack including portions of the display panel stack of FIG. 2.

FIG. 3 depicts a portion of a display panel stack 300 corresponding to a single pixel formed from multiple sub-pixels 305. In some examples, each of the sub-pixels 305 can correspond to a sub-pixel as detailed in FIG. 2. As depicted in FIG. 3, display panel stack 300 includes sub-pixels 305-$r$, 305-$g$, and 305-$b$ (e.g., corresponding to a red, green and blue, sub-pixel). The display panel stack 300 includes a backplane 201 and frontplane 203. The components of the backplane 201 are not depicted for purposes of clarity. However, as depicted in FIG. 2, the backplane can include TFT circuits 220, for example, TFT circuit 220-$r$, 220-$g$ and 220-$b$ are depicted. More particularly, sub-pixel 305-$r$ is depicted including TFT circuit 220-r, sub-pixel 305-g is depicted including TFT circuit 220-g and sub-pixel 305-b is depicted including TFT circuit 220-b.

As depicted are electrical contact pads 270 arranged to couple TFT circuits 220 to μLEDs 230. For example, sub-pixel 305-r depicts μLED 230-r coupled to TFT circuit 220-r via an electrical contact pad 270, sub-pixel 305-g depicts μLED 230-g coupled to TFT circuit 220-g via an electrical contact pad 270 and sub-pixel 305-b depicts μLED 230-b coupled to TFT circuit 220-b via an electrical contact pad 270.

Each subpixel 305 further includes a digital polarizer 240 for the μLED 230 of the respective sub-pixel 305. For example, sub-pixel 305-r includes digital polarizer 240-r disposed above μLED 230-r, sub-pixel 305-g includes digital polarizer 240-g disposed above μLED 230-g and sub-pixel 305-b includes digital polarizer 240-b disposed above μLED 230-b.

Like OLEDs, μLEDs utilize an emissive technology. However, due to the inorganic nature of the emitting materials, their efficiency and narrow emission bands; μLEDs offer the prospect of significantly improved performance in terms of energy consumption, color gamut, brightness, contrast (High Dynamic Range), long lifetime and environmental stability (not sensitive to air, moisture), and compatibility with flexible backplane technologies to enable curved or flexible displays. In addition, μLEDs can also deliver extremely high pixel density (up to 5000 PPI) which, along with very high brightness, make them ideal for applications such as Augmented Reality (AR) or Head Up Display projectors.

Figure 4:
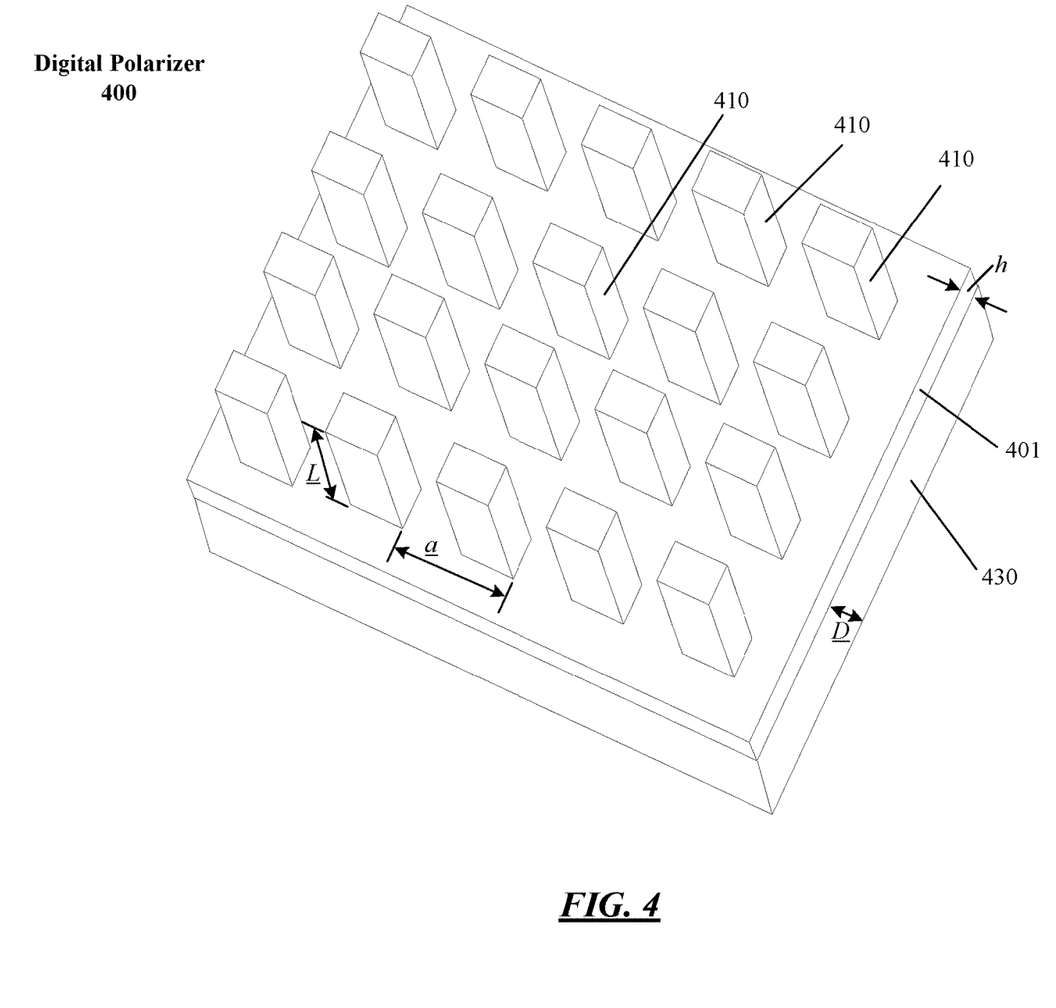
FIG. 4 illustrates a digital polarizer.

FIG. 4 depicts a digital polarizer 400, formed upon a light emitting element 430. More specifically, the digital polarizer 400 is formed on a dielectric spacer 401 which is disposed on a light emitting element 430. The light emitting element 430 can be any one of the above described light emitting elements, such as, one of the array of illumination element 130, the μLED 230, the μLED 230-r, μLED 230-g, or the μLED 230-b. In general, the digital polarizer comprises a number of nanoparticles 410 disposed on a surface in the path of light emitted by the light emitting element 430. In general, the nanoparticles 410 alter the phase of the emitted light or reflect portions of the emitted light, creating a new wavefront. The shape and arrangement (with respect to each other) of the nanoparticles 410 controls the effect the nanoparticles 410 have on the emitted light.

In some examples, nanoparticles 410 can be rectangular, for example as depicted. In other examples, nanoparticles 410 can be cylindrical, square, pyramid shaped, dome shaped, or another arbitrary shape. The shape of nanoparticles 410 can be arranged, designed, formed, or the like to provide a desired manipulative effect on incident light. For example, some implementations can comprise rectangular dielectric cuboid nanoparticles 410, which induce birefringence and have an optical response that may be sensitive to the polarization of the incident radiation.

As depicted, a digital polarizer 400 can be formed from multiple individual nanoparticles 410. For example, the digital polarizer 400 can be formed from organizing nanoparticles 410 in a geometric arrangement, such as a lattice arrangement. In general, the geometric properties or arrangement of individual nanoparticles 410 (with respect to each other), such as, for example, spacing a between nanoparticles 410 and geometric properties (e.g., height L) of nanoparticles 410 can be selected to provide a desired optical response from the digital polarizer 400. It is noted, that the number of nanoparticles 410 comprised in the digital polarizer 400 may vary, and can depend, for example, on the size of the nanoparticles 410, the spacing between nanoparticles 410, and the size of the digital polarizer 400.

In some examples, to achieve full control over the phase of light emitted from element 430 requires precise, high-aspect-ratio (~5:1 or less) nanoparticles 410, which in turn requires the use of nanofabrication methods. A variety of manufacturing methods, such as, for example, silicon manufacturing techniques, optical died manufacturing techniques, or the like, can be employed to form nanoparticles 410.

With some embodiments, nanoparticles 410 are formed from Titanium Oxide ($TiO_2$), which is transparent to visible light (red, green and blue) due its large (3.3 eV) energy gap. In such an embodiment, the height L of nanoparticles 410 may be between 200 and 400 nanometers (nm), the distance a may be between 60 nm and 150 nm. Thus, the aspect ratio of nanoparticles may be <5:1. Other design considerations are the height h of the layer 401 as well as the height D of the element 430. For example, the size and spacing of the nanoparticles 410 can be determined based on the wavelength of the light emitted from the element 430 as well as the heights h and D. As a general rule, the width and length of the nanoparticles 410 can be between $\lambda/10$ and $\lambda/4$ while the height of the nanoparticles 410 can be $\lambda/2$, where X is the wavelength of light emitted from the element 430.

During operation, when light emitted from the element 430 encounters the field of nanoparticles 410 (e.g., the boundary between the element 430 digital polarizer 400, the light is split into a reflected beam that propagates back towards the element 430 and a transmitted beam that proceeds on. The reflection and transmission coefficients and their directions are determined by the continuity of field components at the boundary and are given by the Fresnel equations and Snell's law, respectively. If we add to the interface an array of subwavelength resonators of negligible thickness forming the digital polarizer 400, the reflection and transmission coefficients will be then dramatically changed because the boundary conditions are modified by the resonant excitation of an effective current within the field (or metasurface) formed by nano-particles 410. The reflection and transmission waves carry a phase change that can vary from $-\pi$ to $\pi$, depending on the wavelength of the incident wave relative to the metasurface resonance. When the phase change is uniform along the interface, the directions of reflection and refraction are unaltered. One of the merits provided by metasurfaces is that we can create spatial phase variation with subwavelength resolution to effectively control the direction of wave propagation and the shape of wavefront. Thus, the orientation or the nanoparticles 410 determines the polarization selectivity.

As contemplated herein, electronic devices implemented with display panel stacks arranged according to various embodiments may be targeted for outdoor applications (i.e. tablet computers, cameras, smartphones, music players, etc.). Thus, contrast of the display panel under strong external lighting (e.g., under sunlight, or the like) is a consideration. Various display technologies (e.g., OLED, μLED, or the like) can suffer from legibility problems when viewed in high illumination ambient conditions. Said differently, it can be difficult to distinguish between the on and off pixels that are used to form a displayed image as the reflected ambient light (also referred to as glare). The glare can be either specular (mirror-like) or diffuse, depending on the characteristics of the display panel surface and the ambient light conditions. The contrast of a display panel can be qualitatively defined as the ability to distinguish between the on and off pixels under certain ambient conditions.

Typically, for display contrast, diffuse glare is more important to eliminate because a viewer can usually move or tilt the screen to avoid the specular glare.

As discussed above, the CR of a display can be expressed as a ratio of the brightest and darkest element of the display, taking into account the ambient light reflected from it. This is referenced in Equation (1) detailed above. Increasing CR can also improve the perceived brightness of an image. This is due to the effect known as inhibitory simultaneous contras, which helps to improve legibility of the device without increasing the brightness at the expense of power. According to Equation (1), CR can be increased by (a) improving $L_{ON}$, (b) reducing $L_{OFF}$ and (c) reducing $R_D$ under the ambient conditions.

The better the OLED or μLED efficiency, the higher $L_{ON}$ for a given target power consumption, and the higher the contrast ratio. As μLEDs have better power efficiency than OLEDs, this will result in better CR for μLED based displays.

In the OFF condition, no emission of light from a pixel in a display is desirable, that is, $L_{OFF}=0$. However, unintended emission in displays arises from electrical cross-talk. When one row is selected and only one pixel in it is addressed by keeping the rest of the columns open, the reverse leakage current allows current flow through the non-selected pixels. For μLEDs, $L_{OFF}$ is smaller than in OLEDs, which results in higher CR for μLEDs.

When used for displays, OLEDs must be easily recognizable under ambient illumination. However, this objective is challenging for native OLED geometry due to the presence of reflective metal electrodes. Under conditions of bright illumination, the reflected light can be comparable to the light emitted from OLEDs and the resultant level of contrast can become poor. Optical polarizers in OLED devices, such as the digital polarizers discussed herein, enhance the CR by blocking the internal reflected light from entering a viewer's eyes. Thus, display panel stacks arranged according to embodiments of the present disclosure, including digital polarizers can be to significantly reduce $R_D$ while providing for increase in transmittance versus conventional displays and providing for flexibility of the display panel.

During operation, the digital polarizers (e.g., individual polarizer elements 140, polarizers 240, digital polarizer 400, or the like) increase CR by reducing transmission of reflected light. Said differently, the digital polarizers reduce $R_D$ from Equation (1).

Polarized light is light with its electric vector oriented in a direction which is predicable rather than random. There are two types of polarization: linear polarization, where the electric field is either vertically or horizontally polarized; and circular polarization, where the electric field rotates around the optical axis of light propagation. One can think of light as traveling in waves. These waves can be visualized as a length of rope.

Consider the rope with one end tied to a post. Moving the free end of the rope up and down sets up a "wave" along the rope which also moves up and down. The rope, if representing a beam of light, the light would be "vertically polarized". If the free end is moved from side to side, a wave that moves from side to side is set up. Again, if this was a light beam, you could call it "horizontally polarized". Both of these are examples of plane or linear polarization.

Conversely, moving the free end of the rope around in a circle could set up a wave that looks like a corkscrew. This is analogous to a light beam having circular polarization. The rope couple move in either a clockwise or anticlockwise direction, corresponding to what are referred to as right handed or left handed circular polarized light waves.

Light emitting diodes put out randomly polarized light, i.e. an equal mixture of every kind of polarization. Circularly polarized light can be converted into linearly polarized light by passing it through a quarter-wave plate. Passing linearly polarized light through a quarter-wave plate with its axes at 45° to its polarization axis will convert it to circular polarization.

Partially reflecting surfaces often reflect one, linearly polarized, component of the incoming randomly polarized light much more strongly than the others. In other words, reflection of randomly polarized light from a partially reflecting surface, result in linear, not circular polarization.

A "circular polarizer" actually consists of two elements: a linear polarizer and a quarter wave plate. The quarter wave plate is cemented on the back of the linear polarizer with a specific orientation such that the light emerging from the quarter wave plate is circularly polarized.

Linear polarizers can be divided into two general categories: absorptive polarizers, where the unwanted polarization states are absorbed by the device, and beam-splitting polarizers, where the unpolarized beam is split into two beams with opposite polarization states.

The nanostructures 410 of the digital polarizer 400 can be configured (e.g., geometric shape and arrangement respective to each other) to provide an optical response in light emitted from corresponding each μLED representative of either or both of a circular or linear polarizer. Additionally, the nanostructures 410 can be configured and arranged to modify a trajectory of light emitted from the illumination elements, for example, to steer or direct the displayed image.

Figure 5:
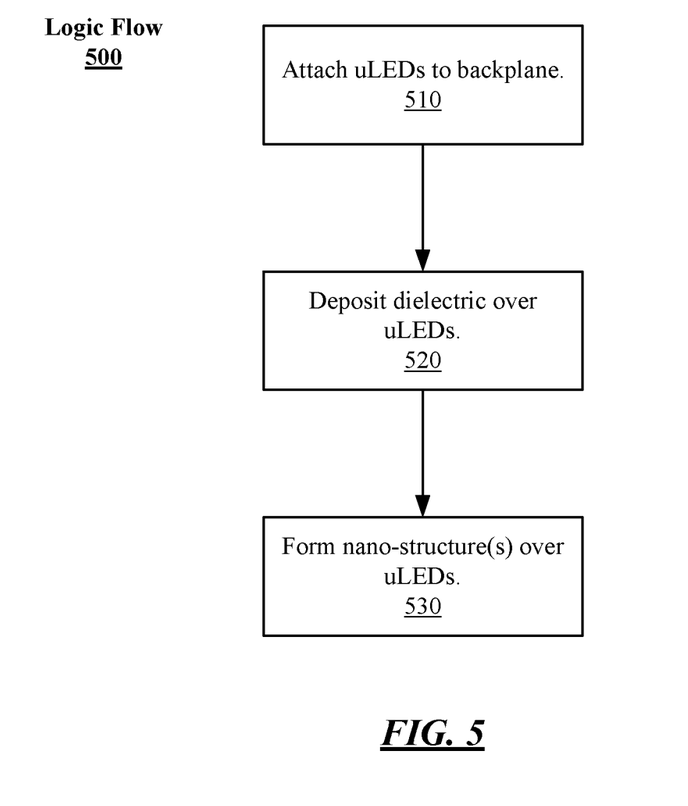
FIG. 5 illustrates a logic flow.

FIG. 5 illustrates a logic flow 500 for forming a display panel stack according to some examples of the present disclosure. Logic flow 500 can be implemented to manufacture a display panel stack according to various embodiments. For example, logic flow 500 can be implemented to manufacture a display panel stack 300 comprising μLEDs and digital polarizers for each μLED.

Logic flow 500 can begin at block 510. At block 510 "attach μLEDs to a backplane" a number of μLEDs can be attached to a backplane. For example, μLED 230 can be attached to respective are electrical contact pads 270 to couple the μLED 230 to backplane 201, and particularly to respective switching circuits 220 in backplane 201. In some examples, μLEDs 230 are manufactured separately from backplane 201. Subsequently, μLEDs 230 are positioned and connected to the backplane (e.g., array of switching elements 120, or the like) via a pick and place process.

Continuing to block 530 "form nanostructure(s) over the μLEDs" a number of nanostructures can be formed over the μLEDs. For example, for each μLED, a digital polarizer can be formed from a number (e.g., one or more, or the like) nanostructures. For example, a digital polarizer 240 for each μLEDs 230 can be formed. Digital polarizers 240 can be like digital polarizer 400. That is, digital polarizers 240 can include a number of nanoparticles 410, where each nanoparticle 410 is a structure having a particle geometric shape and arrangement with respect to other nanoparticles 410 to provide an optical response in light emitted by the μLEDs 230. Specifically, the nanoparticles 410 can be formed to have an optical response to polarize the light to increase a CR of the display panel stack.

Continuing to block 520 "deposit a dielectric over μLEDs" a dielectric layer can be deposited over the μLEDs. For example, dielectric layer 268 can be deposited over the μLEDs 230. With some examples, the dielectric layer can be optional. For example, some display panel stacks may omit the dielectric layer 268 and may pattern or from the digital polarizers directly onto the μLEDs 230. In some examples, the dielectric can be titanium oxide, doped titanium oxide, silicon nitride, doped silicon nitride, or a stack of silicon nitride and titanium oxide.

Figure 6:
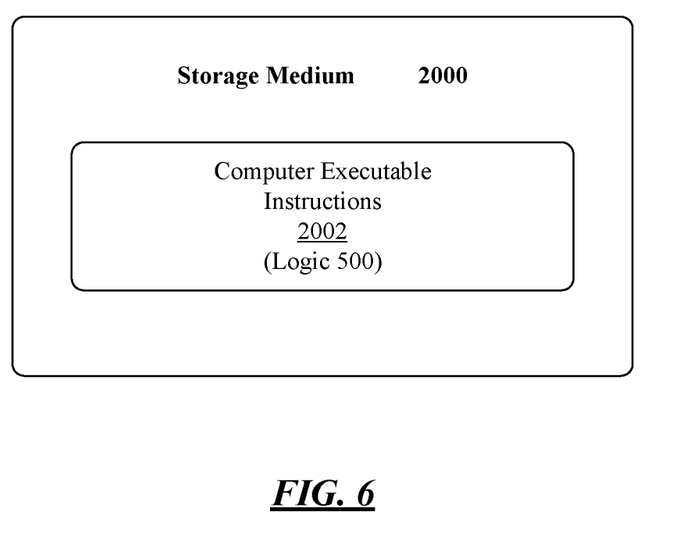
FIG. 6 illustrates an embodiment of a storage medium.

FIG. 6 illustrates an embodiment of a storage medium 2000. The storage medium 2000 may comprise an article of manufacture. In some examples, the storage medium 2000 may include any non-transitory computer readable medium or machine readable medium, such as an optical, magnetic or semiconductor storage. The storage medium 2000 may store various types of computer executable instructions e.g., 2002). For example, the storage medium 2000 may store various types of computer executable instructions to implement logic flow 500. For example, storage medium 2000 can be coupled to manufacturing equipment (e.g., pick and place equipment, lithographic equipment, or the like) and arranged to manufacture a display panel stack with individual digital polarizers as discussed herein.

Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 7:
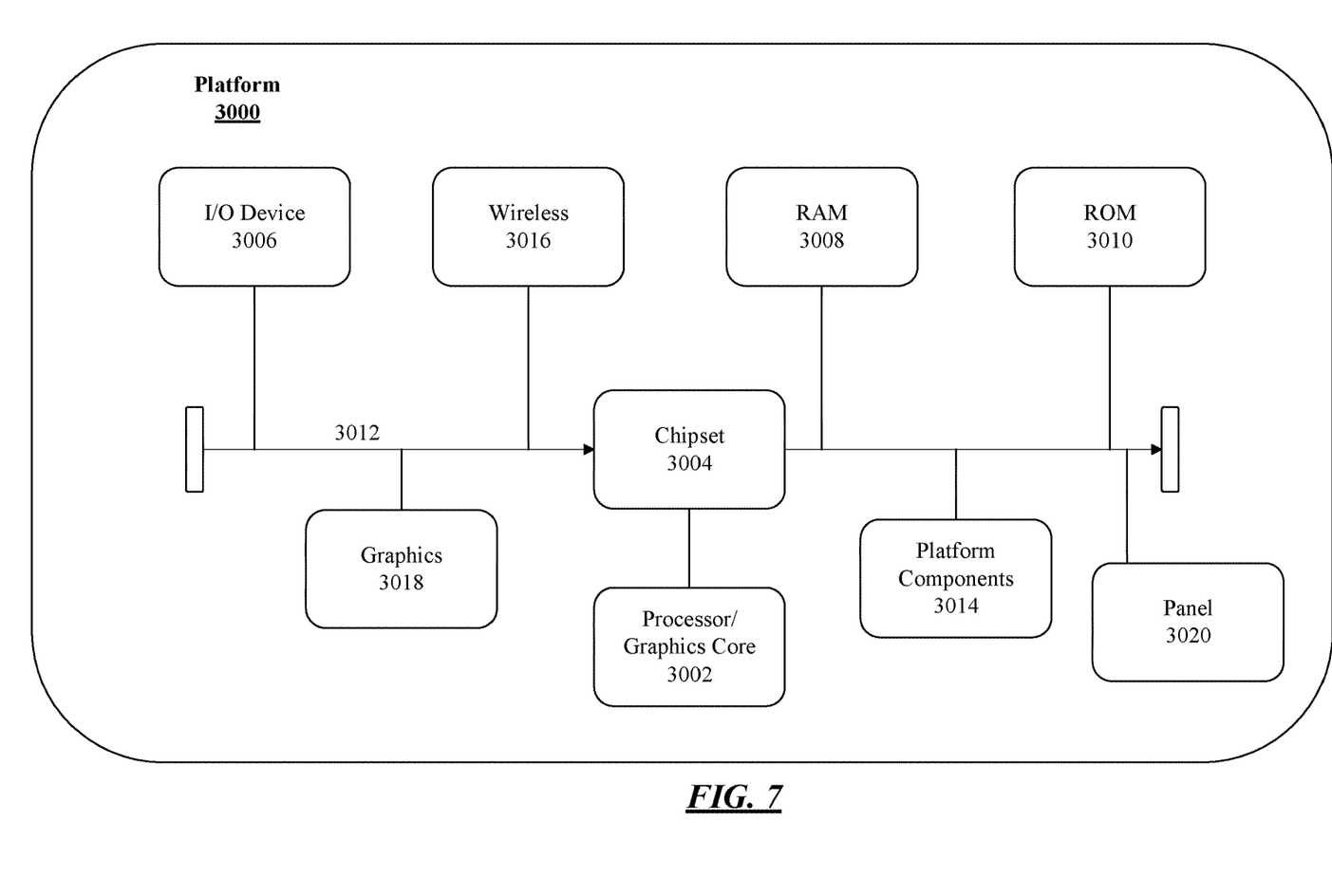
FIG. 7 illustrates an embodiment of a platform.

FIG. 7 is a diagram of an exemplary system embodiment and, depicts a platform 3000, which may include various elements. For instance, this figure depicts that platform (system) 3000 may include a processor/graphics core 3002, a chipset 3004, an input/output (I/O) device 3006, a random-access memory (RAM) (such as dynamic RAM (DRAM)) 3008, and a read only memory (ROM) 3010, panel 3020 (e.g., display panel stack 100, display panel stack 200, display panel stack 300, or the like) and various other platform components 3014 (e.g., a fan, a cross flow blower, a heat sink, DTM system, cooling system, housing, vents, and so forth). System 3000 may also include wireless communications chip 3016 and graphics device 3018. The embodiments, however, are not limited to these elements.

As depicted, I/O device 3006, RAM 3008, and ROM 3010 are coupled to processor 3002 by way of chipset 3004. Chipset 3004 may be coupled to processor 3002 by a bus 3012. Accordingly, bus 3012 may include multiple lines.

Processor 3002 may be a central processing unit comprising one or more processor cores and may include any number of processors having any number of processor cores. The processor 3002 may include any type of processing unit, such as, for example, CPU, multi-processing unit, a reduced instruction set computer (RISC), a processor that has a pipeline, a complex instruction set computer (CISC), digital signal processor (DSP), and so forth. In some embodiments, processor 3002 may be multiple separate processors located on separate integrated circuit chips. In some embodiments processor 3002 may be a processor having integrated graphics, while in other embodiments processor 3002 may be a graphics core or cores.

Figure 8:
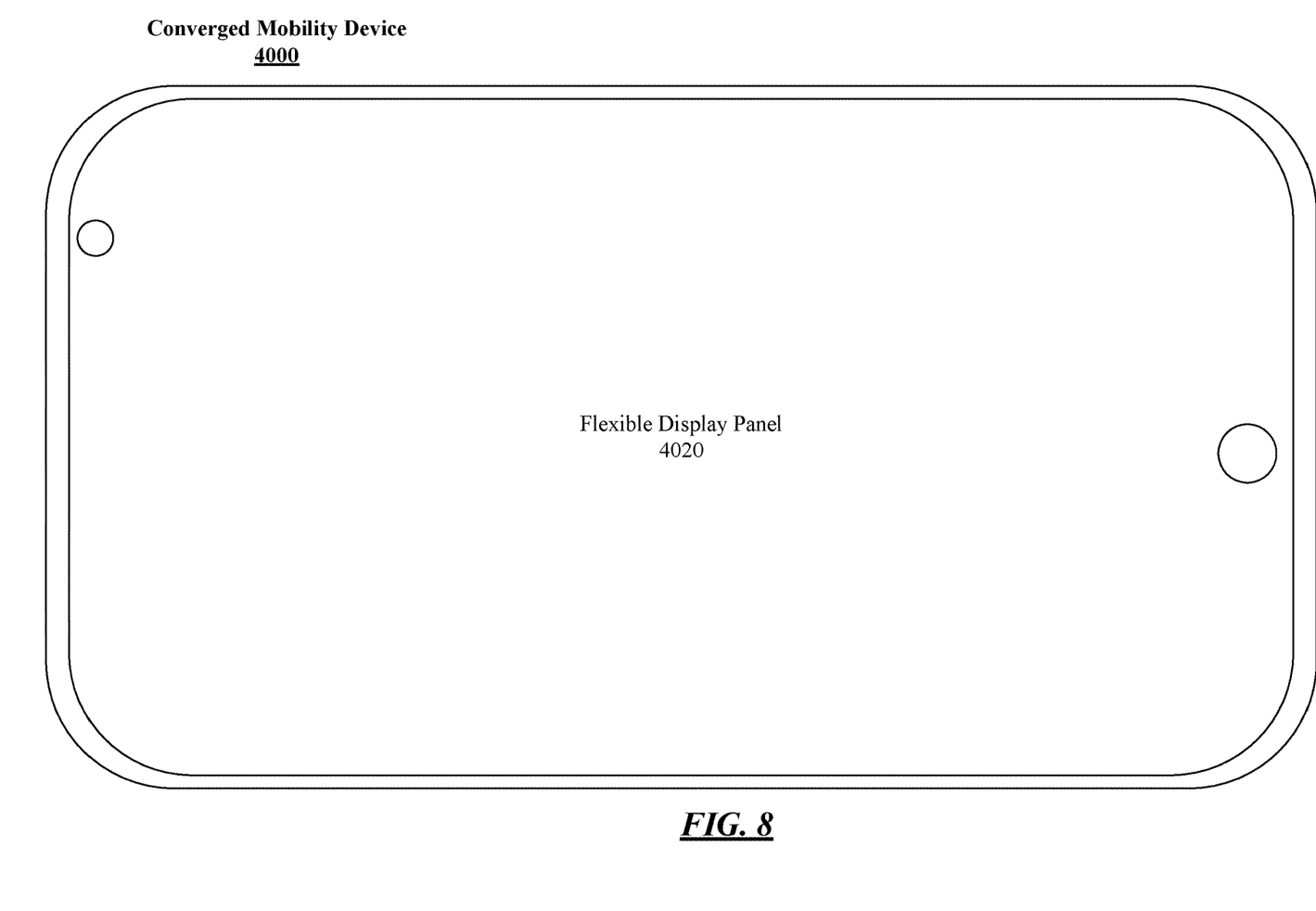
FIG. 8 illustrates an embodiment of a device.

FIG. 8 is a diagram of an exemplary diagram of a converged mobility device 4000, which includes a flexible display panel 4020. The flexible display panel 4020 can include a display panel having a flexible backplane (e.g., the backplane 201) and a flexible frontplane (e.g., the frontplane 203) where the frontplane includes light emitting elements (e.g., μLEDs 230) and a corresponding digital polarizer (e.g., polarizers 240) for each light emitting element. The converged mobility device 4000 may be a tablet computer, a smart phone, or other device having a display panel 4020, which can be flexible.

The disclosure now turns to providing a number of illustrative examples.

Example 1

A display panel stack, comprising: a plurality of light illumination elements; and a digital polarizer, for each one of the plurality of light illumination elements, the digital polarizers to polarize light emitted from the plurality of light illumination elements.

Example 2

The display panel stack of example 1, the digital polarizer comprising a plurality of nanostructures.

Example 3

The display panel stack of example 2, each of the plurality of nanostructures comprising a rectangular or square shape.

Example 4

The display panel stack of example 2, the plurality of nanostructures spaced apart from each other between 60 and 150 nanometers.

Example 5

The display panel stack of example 2, the plurality of nanostructures having a height between 200 and 400 nanometers.

Example 6

The display panel stack of claim 2, the plurality of nanostructures having a rectangular shape with a width and length of between $\frac{1}{10}^{th}$ and $\frac{1}{4}^{th}$ of a wavelength of light emitted by the plurality of illumination elements.

Example 7

The display panel stack of claim 6, the plurality of nanostructures having a height of approximately ½ of the wavelength of light emitted by the plurality of illumination elements.

Example 8

The display panel stack of example 1, the plurality of illumination elements comprising micro-light emitting diodes (μLEDs), organic LEDs (OLEDs) or vertical-cavity surface-emitting laser (VCSELs).

Example 9

The display panel stack of example 1, comprising a plurality of switching element coupled to the plurality of light illumination elements.

Example 10

The display panel stack of example 9, the plurality of switching elements comprising thin-film-transistors (TFTs).

Example 11

The display panel stack of example 1, comprising a dielectric layer disposed between the plurality of light illumination elements and the digital polarizer.

Example 12

The display panel stack of example 11, the dielectric layer comprising titanium oxide, doped titanium oxide, silicon nitride, doped silicon nitride, or a stack of silicon nitride and titanium oxide.

Example 13

A flexible display panel comprising: a flexible substrate; a plurality of switching elements disposed on the flexible substrate; a plurality of light illumination elements coupled to the plurality of switching elements; and a digital polarizer, for each one of the plurality of light illumination elements, the digital polarizers to polarize light emitted from the plurality of light illumination elements.

Example 14

The flexible display panel of example 13, the digital polarizer comprising a plurality of nanostructures.

Example 15

The flexible display panel of example 14, each of the plurality of nanostructures comprising a rectangular or square shape.

Example 16

The flexible display panel of example 14, the plurality of nanostructures spaced apart from each other between 60 and 150 nanometers.

Example 17

The flexible display panel of example 14, the plurality of nanostructures having a height between 200 and 400 nanometers.

Example 18

The flexible display panel of example 14, the plurality of nanostructures having a rectangular shape with a width and length of between $\frac{1}{10}$th and $\frac{1}{4}$th of a wavelength of light emitted by the plurality of illumination elements and a height of approximately $\frac{1}{2}$ of the wavelength of light emitted by the plurality of illumination elements.

Example 19

The flexible display panel of example 13, the plurality of illumination elements comprising micro-light emitting diodes (μLEDs), organic LEDs (OLEDs) or vertical-cavity surface-emitting laser (VCSELs).

Example 20

The flexible display panel of example 13, the plurality of switching elements comprising thin-film-transistors (TFTs).

Example 21

The flexible display panel of example 13, comprising a dielectric layer disposed between the plurality of light illumination elements and the digital polarizer.

Example 22

The display panel stack of example 21, the dielectric layer comprising titanium oxide, doped titanium oxide, silicon nitride, doped silicon nitride, or a stack of silicon nitride and titanium oxide.

Example 23

A mobile device comprising: a display panel comprising: a plurality of switching elements disposed on the flexible substrate; a plurality of light illumination elements coupled to the plurality of switching elements; and a digital polarizer, for each one of the plurality of light illumination elements, the digital polarizers to polarize light emitted from the plurality of light illumination elements; a processor coupled to the display panel; and a memory coupled to the processor, the memory comprising instructions that when executed by the processor cause the processor to send pixel data to the display panel to display an image based on the pixel data.

Example 24

The mobile device of example 23, the digital polarizer comprising a plurality of nanostructures, each of the plurality of nanostructures comprising a rectangular, cylindrical, square, pyramid, or dome shape.

Example 25

The mobile device of example 24, the plurality of nanostructures spaced apart from each other between 60 and 150 nanometers.

Example 26

The mobile device of example 24, the plurality of nanostructures having a height between 200 and 400 nanometers.

Example 27

The mobile device of example 24, the plurality of nanostructures having a rectangular shape with a width and length of between $\frac{1}{10}$th and $\frac{1}{4}$th of a wavelength of light emitted by the plurality of illumination elements and a height of approximately $\frac{1}{2}$ of the wavelength of light emitted by the plurality of illumination elements.

Example 28

The mobile device of example 23, the plurality of illumination elements comprising micro-light emitting diodes (μLEDs), organic LEDs (OLEDs) or vertical-cavity surface-emitting laser (VCSELs).

Example 29

The mobile device of example 23, the display panel comprising a dielectric layer disposed between the plurality of light illumination elements and the digital polarizer.

Example 30

The mobile device of example 29, the dielectric layer comprising titanium oxide, doped titanium oxide, silicon nitride, doped silicon nitride, or a stack of silicon nitride and titanium oxide.

Example 31

A method comprising: providing a backplane comprising a plurality of switching elements disposed on a substrate; attaching a plurality of light illumination elements to the display panel backplane to couple the plurality of light illumination elements to the plurality of switching elements; depositing a dielectric over the plurality of light illumination elements; and forming a digital polarizer for each one of the plurality of light illumination elements.

Example 32

The method of example 31, forming each one of the digital polarizers comprising forming a plurality of nanostructures.

Example 33

The method of example 32, each of the plurality of nanostructures comprising a rectangular or square shape.

Example 34

The method of example 32, the plurality of nanostructures spaced apart from each other between 60 and 150 nanometers.

Example 35

The method of example 32, the plurality of nanostructures having a height between 200 and 400 nanometers.

Example 36

The method of example 32, the plurality of nanostructures having a rectangular shape with a width and length of between 1/10th and 1/4th of a wavelength of light emitted by the plurality of illumination elements and a height of approximately 1/2 of the wavelength of light emitted by the plurality of illumination elements.

Example 37

The method of example 31, the plurality of illumination elements comprising micro-light emitting diodes (μLEDs), organic LEDs (OLEDs) or vertical-cavity surface-emitting laser (VCSELs).

Example 38

The method of example 31, the plurality of switching elements comprising thin-film-transistors (TFTs).

Example 39

The method of example 31, the dielectric layer comprising titanium oxide, doped titanium oxide, silicon nitride, doped silicon nitride, or a stack of silicon nitride and titanium oxide.

Example 40

The method of example 31, the substrate comprising a flexible substrate.

Example 41

An apparatus formed from any one of the methods of examples 31 to 40.

Example 42

A display comprising: a plurality of light illumination means; and a digital polarization means, for each one of the plurality of light illumination means, the digital polarization means to polarize light emitted from the plurality of light illumination means.

Example 43

The display of example 42, the digital polarization means comprising a plurality of nanostructures.

Example 44

The display of example 43, each of the plurality of nanostructures comprising a rectangular or square shape.

Example 45

The display of example 43, the plurality of nanostructures spaced apart from each other between 60 and 150 nanometers.

Example 46

The display of example 43, the plurality of nanostructures having a height between 200 and 400 nanometers.

Example 47

The display of example 43, the plurality of nanostructures having a rectangular shape with a width and length of between 1/10th and 1/4th of a wavelength of light emitted by the plurality of illumination elements and a height of approximately 1/2 of the wavelength of light emitted by the plurality of illumination elements.

Example 48

The display of example 42, the plurality of illumination means comprising micro-light emitting diodes (μLEDs), organic LEDs (OLEDs) or vertical-cavity surface-emitting laser (VCSELs).

Example 49

The display of example 42, comprising a plurality of switching means coupled to the plurality of light illumination means.

Example 50

The display of example 49, the plurality of switching means comprising thin-film-transistors (TFTs).

Example 51

The display of example 42, comprising a dielectric means layer disposed between the plurality of light illumination means and the digital polarization means.

Example 52

The display example 51, the dielectric means layer comprising titanium oxide, doped titanium oxide, silicon nitride, doped silicon nitride, or a stack of silicon nitride and titanium oxide.

Some embodiments may be described using the expression "one embodiment" or "an embodiment" along with their derivatives. These terms mean that a feature, structure, or characteristic described relating to the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, various features are grouped together in a single embodiment for streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment. In the appended claims, the terms "including" and "in which" are used as the Plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The invention claimed is:

1. A display panel stack, comprising:
    a plurality of light illumination elements; and
    a digital polarizer comprising a plurality of nanostructures, for each one of the plurality of light illumination elements, the digital polarizers to polarize light emitted from the plurality of light illumination elements.

2. The display panel stack of claim 1, each of the plurality of nanostructures comprising a rectangular or square shape.

3. The display panel stack of claim 1, the plurality of nanostructures spaced apart from each other between 60 and 150 nanometers.

4. The display panel stack of claim 1, the plurality of nanostructures having a height between 200 and 400 nanometers.

5. The display panel stack of claim 1, the plurality of illumination elements comprising micro-light emitting diodes (μLEDs), organic LEDs (OLEDs) or vertical-cavity surface-emitting laser (VCSELs).

6. The display panel stack of claim 1, comprising a dielectric layer disposed between the plurality of light illumination elements and the digital polarizer, the dielectric layer comprising titanium oxide, doped titanium oxide, silicon nitride, doped silicon nitride, or a stack of silicon nitride and titanium oxide.

7. The display panel stack of claim 1, the plurality of nanostructures having a rectangular shape with a width and length of between $1/10^{th}$ and $1/4^{th}$ of a wavelength of light emitted by the plurality of illumination elements.

8. The display panel stack of claim 7, the plurality of nanostructures having a height of approximately ½ of the wavelength of light emitted by the plurality of illumination elements.

9. The display panel stack of claim 1, comprising a plurality of switching element coupled to the plurality of light illumination elements.

10. The display panel stack of claim 9, the plurality of switching elements comprising thin-film-transistors (TFTs).

11. A flexible display panel comprising:
    a flexible substrate;
    a plurality of switching elements disposed on the flexible substrate;
    a plurality of light illumination elements coupled to the plurality of switching elements; and
    a digital polarizer comprising a plurality of nanostructures, for each one of the plurality of light illumination elements, the digital polarizers to polarize light emitted from the plurality of light illumination elements.

12. The flexible display panel of claim 11, each of the plurality of nanostructures comprising a rectangular or square shape.

13. The flexible display panel of claim 11, the plurality of nanostructures spaced apart from each other between 60 and 150 nanometers.

14. The flexible display panel of claim 11, the plurality of nanostructures having a height between 200 and 400 nanometers.

15. The flexible display panel of claim 11, the plurality of nanostructures having a rectangular shape with a width and length of between $1/10^{th}$ and $1/4^{th}$ of a wavelength of light emitted by the plurality of illumination elements and a height of approximately ½ of the wavelength of light emitted by the plurality of illumination elements.

16. The flexible display panel of claim 11, the plurality of illumination elements comprising micro-light emitting diodes (μLEDs), organic LEDs (OLEDs) or vertical-cavity surface-emitting laser (VCSELs).

17. The flexible display panel of claim 11, the plurality of switching elements comprising thin-film-transistors (TFTs).

18. A mobile device comprising:
a display panel comprising:
a plurality of switching elements disposed on a flexible substrate;
a plurality of light illumination elements coupled to the plurality of switching elements; and
a digital polarizer comprising a plurality of nanostructures, for each one of the plurality of light illumination elements, the digital polarizers to polarize light emitted from the plurality of light illumination elements;
a processor coupled to the display panel; and
a memory coupled to the processor, the memory comprising instructions that when executed by the processor cause the processor to send pixel data to the display panel to display an image based on the pixel data.

19. The mobile device of claim 18, the plurality of illumination elements comprising micro-light emitting diodes (µLEDs), organic LEDs (OLEDs) or vertical-cavity surface-emitting laser (VCSELs).

20. The mobile device of claim 18, each of the plurality of nanostructures comprising a rectangular, cylindrical, square, pyramid, or dome shape.

21. The mobile device of claim 20, the plurality of nanostructures spaced apart from each other between 60 and 150 nanometers.

22. The mobile device of claim 20, the plurality of nanostructures having a height between 200 and 400 nanometers.

23. The mobile device of claim 20, the plurality of nanostructures having a rectangular shape with a width and length of between $1/10^{th}$ and $1/4^{th}$ of a wavelength of light emitted by the plurality of illumination elements and a height of approximately ½ of the wavelength of light emitted by the plurality of illumination elements.

* * * * *